United States Patent
Ando et al.

(10) Patent No.: US 8,097,500 B2
(45) Date of Patent: Jan. 17, 2012

(54) METHOD AND APPARATUS FOR FABRICATING A HIGH-PERFORMANCE BAND-EDGE COMPLEMENTARY METAL-OXIDE-SEMICONDUCTOR DEVICE

(75) Inventors: Takashi Ando, Yokohama (JP); Eduard A. Cartier, New York, NY (US); Changhwan Choi, Yorktown Heights, NY (US); Elizabeth A. Duch, Carmel, NY (US); Bruce B. Doris, Brewster, NY (US); Young-Hee Kim, Mohegan Lake, NY (US); Vijay Narayanan, New York, NY (US); James Pan, West Jordan, UT (US); Vamsi K. Paruchuri, Albany, NY (US)

(73) Assignee: International Business Machines Corporation, Armonk, NY (US)

( * ) Notice: Subject to any disclaimer, the term of this patent is extended or adjusted under 35 U.S.C. 154(b) by 622 days.

(21) Appl. No.: 12/013,846

(22) Filed: Jan. 14, 2008

(65) Prior Publication Data

US 2009/0181505 A1    Jul. 16, 2009

(51) Int. Cl.
*H01L 21/00* (2006.01)
(52) U.S. Cl. .................. 438/197; 438/199; 438/205
(58) Field of Classification Search .................. 438/197, 438/199, 205
See application file for complete search history.

(56) References Cited

U.S. PATENT DOCUMENTS

| | | | |
|---|---|---|---|
| 7,056,782 B2 * | 6/2006 | Amos et al. | 438/199 |
| 7,265,428 B2 * | 9/2007 | Aoyama | 257/413 |
| 7,271,455 B2 * | 9/2007 | Cabral et al. | 257/382 |
| 7,411,227 B2 * | 8/2008 | Amos et al. | 257/204 |
| 7,432,567 B2 * | 10/2008 | Doris et al. | 257/407 |
| 7,479,683 B2 * | 1/2009 | Bojarczuk et al. | 257/410 |
| 7,528,450 B2 * | 5/2009 | Aoyama | 257/369 |
| 7,598,545 B2 * | 10/2009 | Cartier et al. | 257/251 |
| 7,655,557 B2 * | 2/2010 | Amos et al. | 438/630 |
| 7,666,732 B2 * | 2/2010 | Doris et al. | 438/205 |
| 7,709,902 B2 * | 5/2010 | Doris et al. | 257/369 |
| 7,723,192 B2 * | 5/2010 | Carter et al. | 438/275 |
| 7,785,999 B2 * | 8/2010 | Cabral et al. | 438/597 |
| 7,928,514 B2 * | 4/2011 | Bojarczuk et al. | 257/369 |
| 2003/0151098 A1 * | 8/2003 | Nishida et al. | 257/369 |
| 2005/0186747 A1 * | 8/2005 | Amos et al. | 438/301 |
| 2005/0199963 A1 * | 9/2005 | Aoyama | 257/369 |
| 2005/0269635 A1 * | 12/2005 | Bojarczuk et al. | 257/338 |
| 2006/0022280 A1 * | 2/2006 | Cabral et al. | 257/382 |
| 2006/0189061 A1 * | 8/2006 | Amos et al. | 438/199 |
| 2006/0237796 A1 * | 10/2006 | Cartier et al. | 257/371 |
| 2007/0148838 A1 * | 6/2007 | Doris et al. | 438/197 |
| 2008/0026551 A1 * | 1/2008 | Cabral et al. | 438/585 |
| 2008/0054365 A1 * | 3/2008 | Aoyama | 257/369 |
| 2008/0173947 A1 * | 7/2008 | Hou et al. | 257/369 |
| 2008/0254622 A1 * | 10/2008 | Amos et al. | 438/683 |
| 2009/0008719 A1 * | 1/2009 | Doris et al. | 257/369 |
| 2009/0008720 A1 * | 1/2009 | Doris et al. | 257/369 |
| 2009/0011552 A1 * | 1/2009 | Doris et al. | 438/199 |
| 2009/0108294 A1 * | 4/2009 | Choi et al. | 257/190 |
| 2009/0114995 A1 * | 5/2009 | Suzuki et al. | 257/369 |
| 2009/0152642 A1 * | 6/2009 | Bojarczuk et al. | 257/369 |
| 2009/0181505 A1 * | 7/2009 | Ando et al. | 438/216 |
| 2009/0206416 A1 * | 8/2009 | Cheng et al. | 257/369 |

(Continued)

*Primary Examiner* — Laura M Menz

(57) ABSTRACT

In one embodiment, the invention is a method and apparatus for fabricating a high-performance band-edge complementary metal-oxide-semiconductor device. One embodiment of a method for fabricating a complementary metal-oxide-semiconductor device includes fabricating an n-type metal-oxide-semiconductor device using a gate first process, and fabricating a p-type metal-oxide-semiconductor device using a gate last process.

13 Claims, 15 Drawing Sheets

U.S. PATENT DOCUMENTS

| | | |
|---|---|---|
| 2009/0230463 A1* | 9/2009 | Carter et al. ............... 257/327 |
| 2009/0230479 A1* | 9/2009 | Hsu et al. ................. 257/369 |
| 2009/0302399 A1* | 12/2009 | Cartier et al. ............. 257/407 |
| 2010/0044782 A1* | 2/2010 | Carter et al. .............. 257/327 |
| 2010/0052066 A1* | 3/2010 | Yu et al. ................... 257/369 |
| 2010/0059823 A1* | 3/2010 | Chung et al. ............... 257/355 |
| 2010/0102399 A1* | 4/2010 | Hyun et al. ................. 257/402 |
| 2010/0200937 A1* | 8/2010 | Bedell et al. ............... 257/410 |
| 2011/0001194 A1* | 1/2011 | Hou et al. .................. 257/369 |

\* cited by examiner

METHOD AND APPARATUS FOR FABRICATING A HIGH-PERFORMANCE BAND-EDGE COMPLEMENTARY METAL-OXIDE-SEMICONDUCTOR DEVICE

BACKGROUND OF THE INVENTION

The present invention relates generally to integrated circuits, and relates more particularly to high-performance band-edge complementary metal-oxide-semiconductor technology.

Complementary metal-oxide-semiconductor (CMOS) is a major class of integrated circuits. CMOS technology is used in microprocessors, microcontrollers, static random access memory (RAM), and other digital logic circuits. To meet performance requirements for 32 nm and beyond technology nodes, manufacturers have proposed replacing conventional polysilicon gate electrodes with high-K dielectric materials and replacing conventional silicon dioxide-based gate dielectrics with metal gate materials. In addition, capping material on the high-K dielectric gate electrode, on the metal gate dielectric, or on the gate electrode material has been proposed to lower the threshold voltage (Vt) of the transistor for better short channel effect.

Most attempts to fabricate such CMOS devices with the capping, however, have produced undesirable effects. For instance, although band-edge n-type metal-oxide-semiconductor field effect transistors (BE nMOSFETs) have been successfully produced by capping the high-K dielectric gate electrode through conventional gate first processing, the high-temperature annealing process results in interfacial oxide growth and flatband voltage (Vfb)/threshold voltage (Vt) instability in BE p-type metal-oxide-semiconductor (BE pMOSFETs). At lower temperatures, however, planarization of the two different n-type and p-type materials has proven challenging, and re-deposition of the high-K dielectric gate electrode material has resulted in detrimental parasitic capacitance.

Thus, there is a need in the art for a method and apparatus for fabricating a high-performance band-edge complementary metal-oxide-semiconductor device.

SUMMARY OF THE INVENTION

In one embodiment, the invention is a method and apparatus for fabricating a high-performance band-edge complementary metal-oxide-semiconductor device. One embodiment of a method for fabricating a complementary metal-oxide-semiconductor device includes fabricating an n-type metal-oxide-semiconductor device using a gate first process, and fabricating a p-type metal-oxide-semiconductor device using a gate last process.

BRIEF DESCRIPTION OF THE DRAWINGS

So that the manner in which the above recited features of the present invention can be understood in detail, a more particular description of the invention may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

In one embodiment, the present invention is a method and apparatus for fabricating a high-performance band-edge complementary metal-oxide-semiconductor (BE CMOS) device. Embodiments of the present invention fabricate a band-edge n-type metal-oxide-semiconductor field effect transistor (BE nMOSFET) using a gate first process and fabricate a band-edge p-type metal-oxide-semiconductor field effect transistor (BE pMOSFET) using a gate last process. The benefits of using the gate first process for fabrication of the nMOSFET are thus retained, while the drawbacks of using the gate first process for the pMOSFET are avoided. Embodiments of the present invention may be fabricated on semiconductor substrates comprising silicon (Si), silicon germanium (SiGe), gallium arsenide (GaAs), or the like. In one embodiment, a substrate for the nMOSFET comprises silicon, while a substrate for the pMOSFET comprises silicon germanium.

Within the context of the present invention, a "gate first process" is understood to refer to a process used in CMOS fabrication in which the source and the drain are formed after the formation (patterning) of the gate stack. This is typically a high-temperature process. Within the context of the present invention, a "gate last process" is understood to refer to a process used in CMOS fabrication in which the source and the drain are formed before the formation of the gate stack. This is typically a low-temperature process.

Figure 1A:
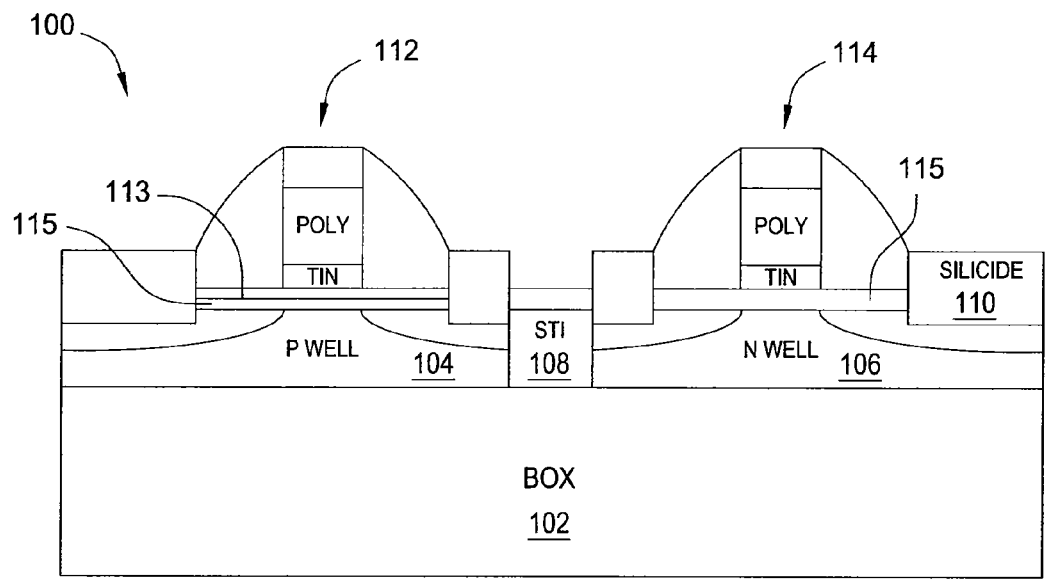
FIG. 1A-1P are cross-sectional diagrams illustrating various fabrication stages of a band-edge complementary metal-oxide-semiconductor device, according to a first embodiment of the present invention.
Figure 1B:
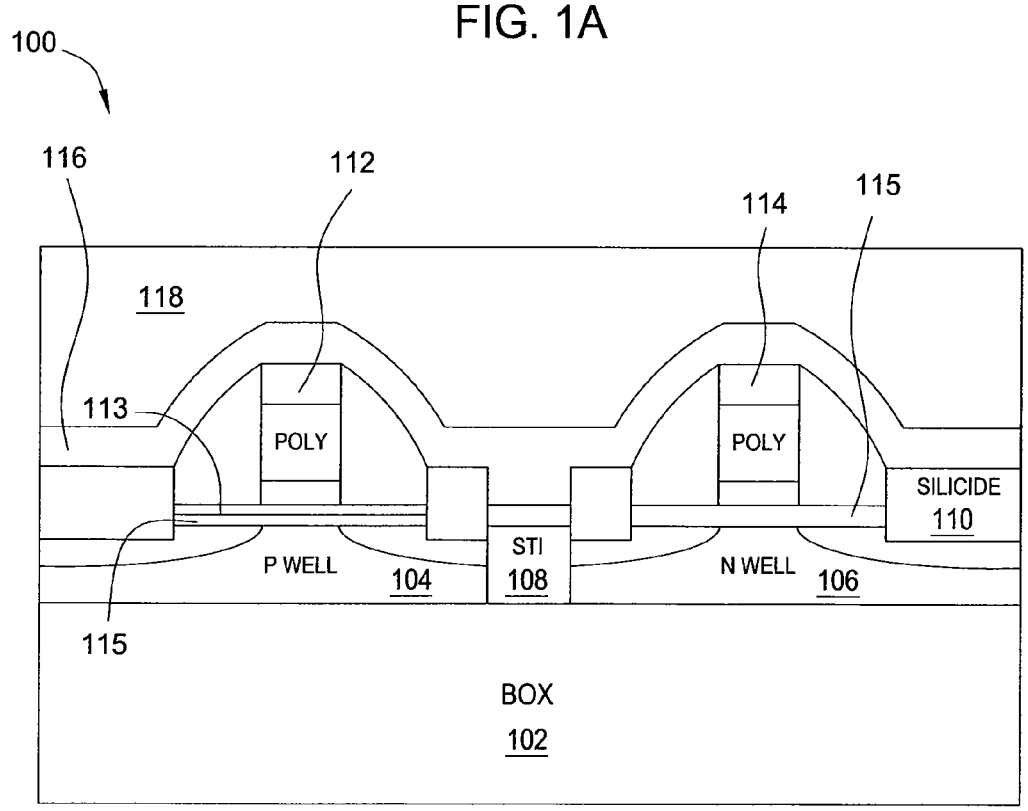
Figure 1C:
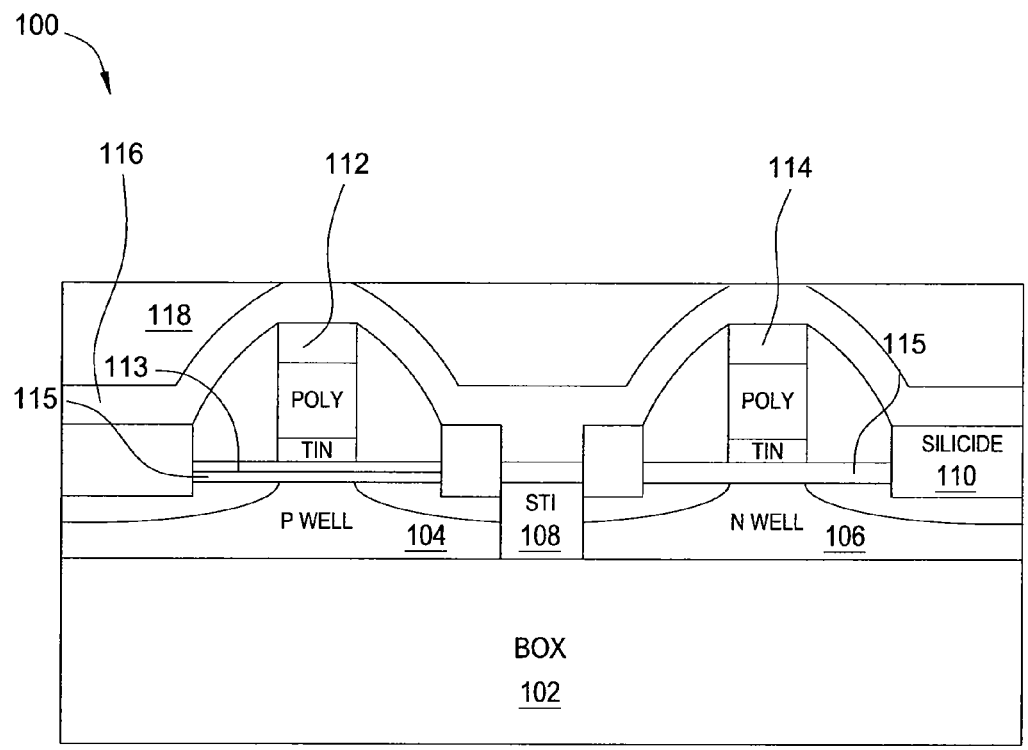
Figure 1D:
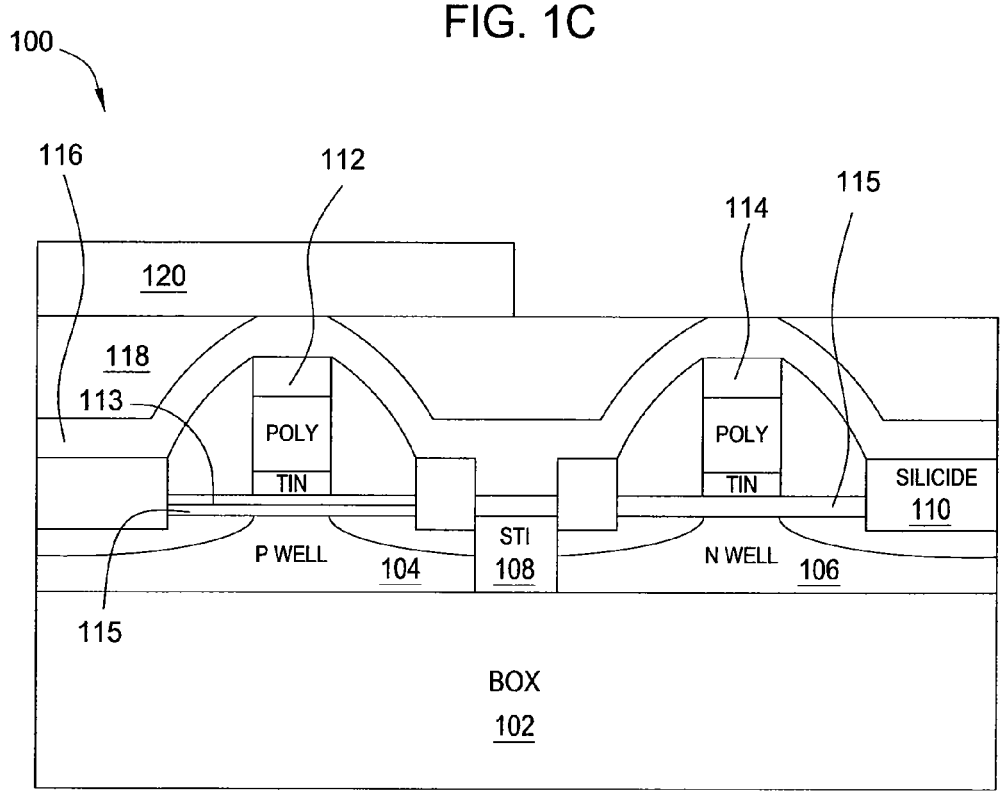
Figure 1E:
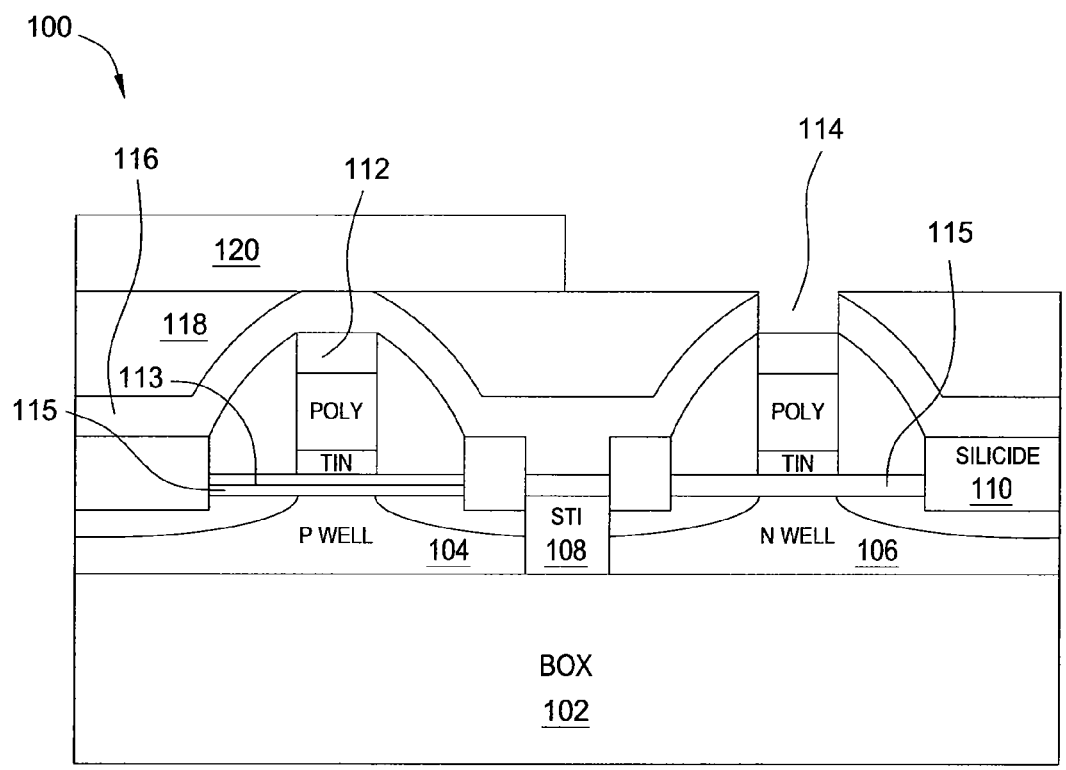
Figure 1F:
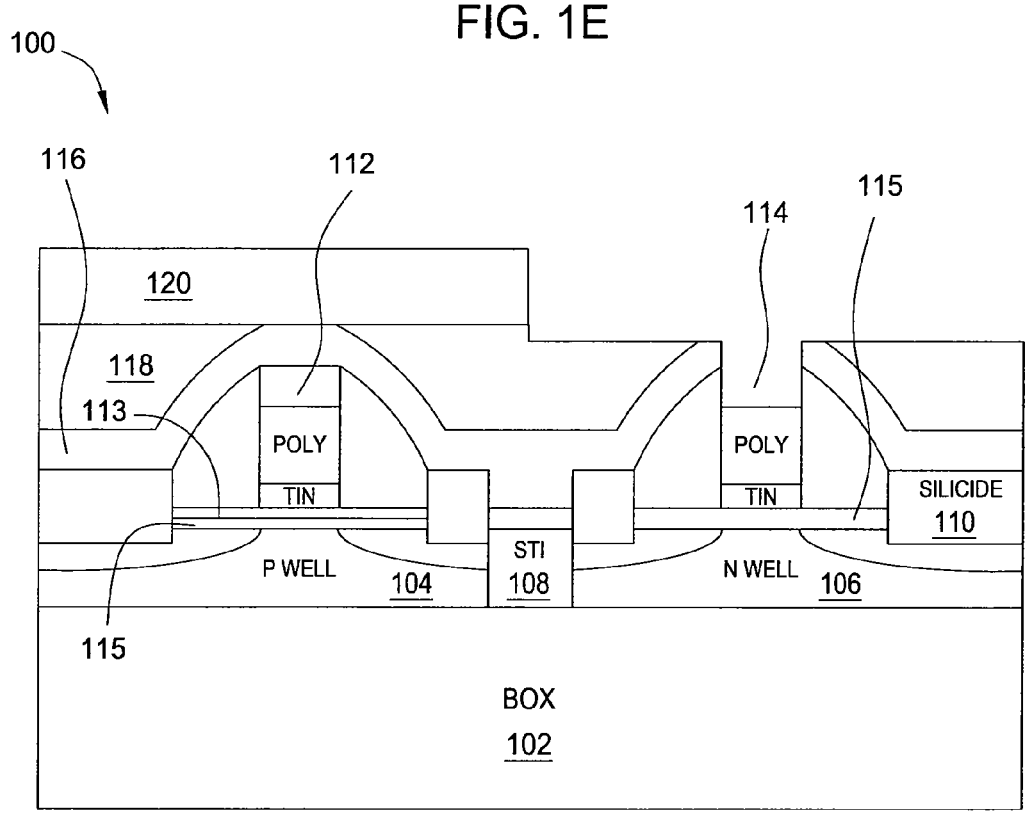
Figure 1G:
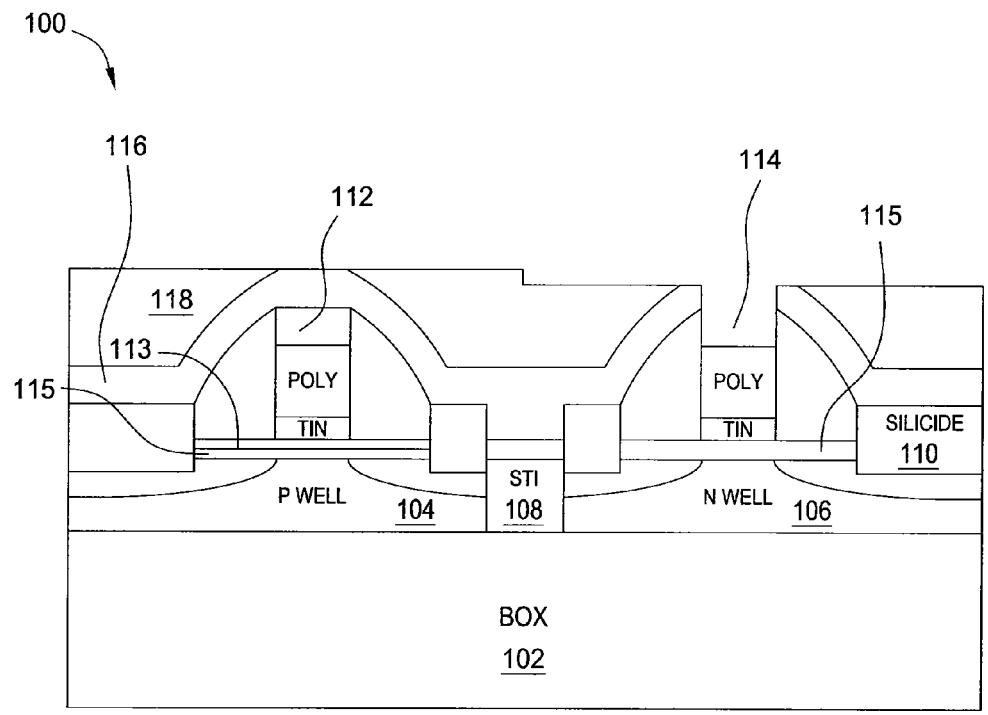
Figure 1H:
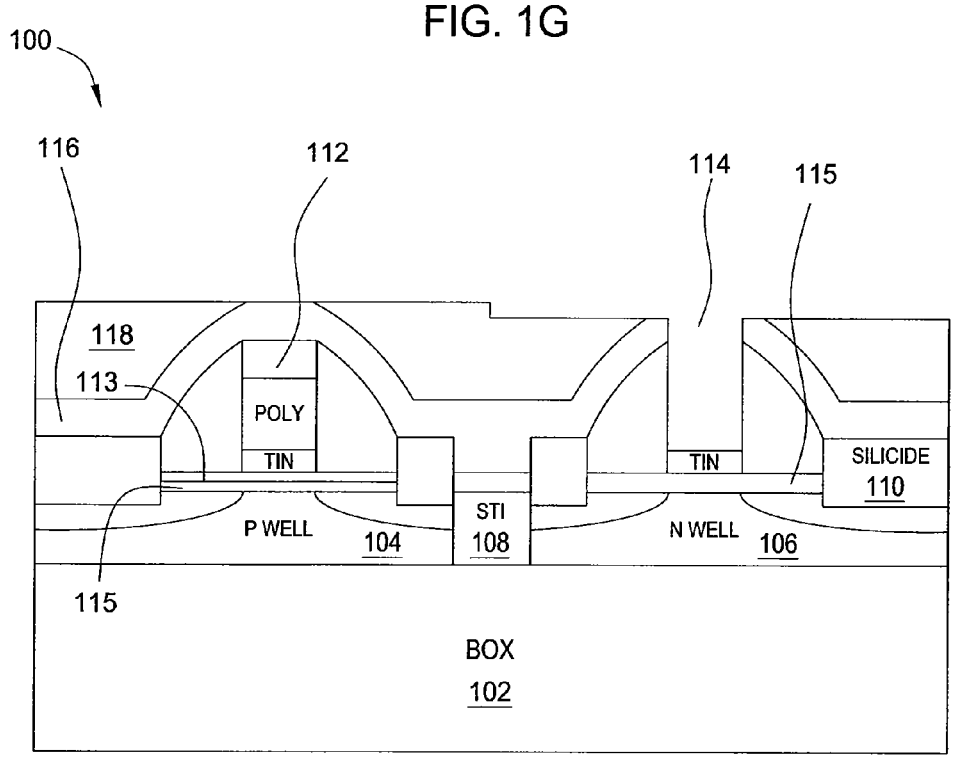
Figure 1I:
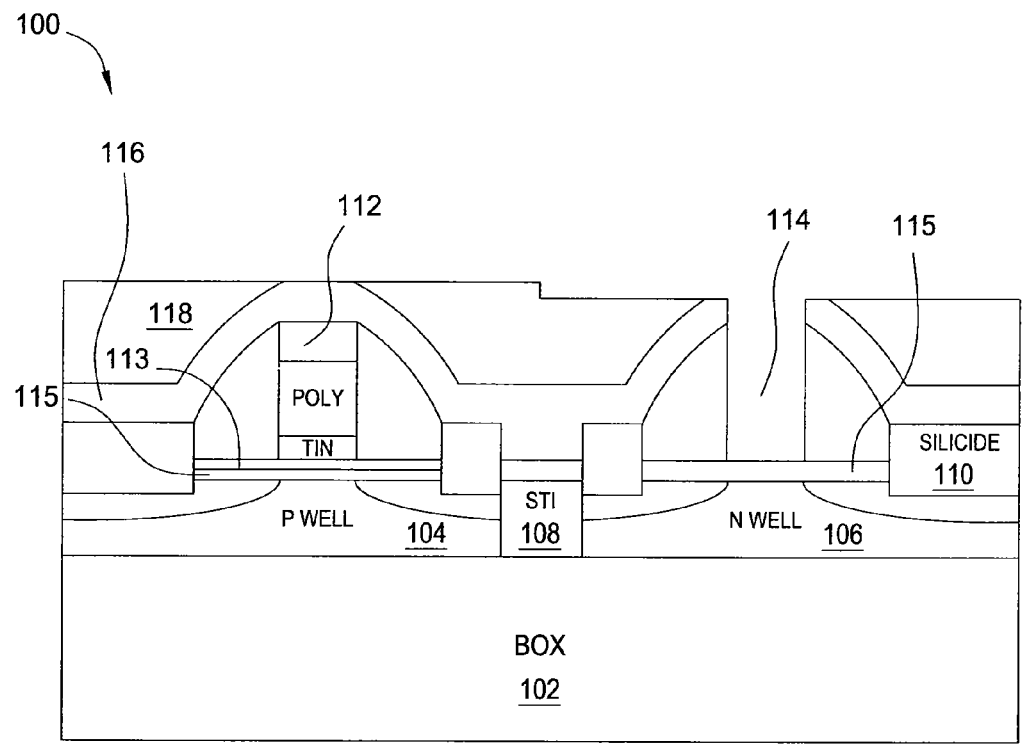
Figure 1J:
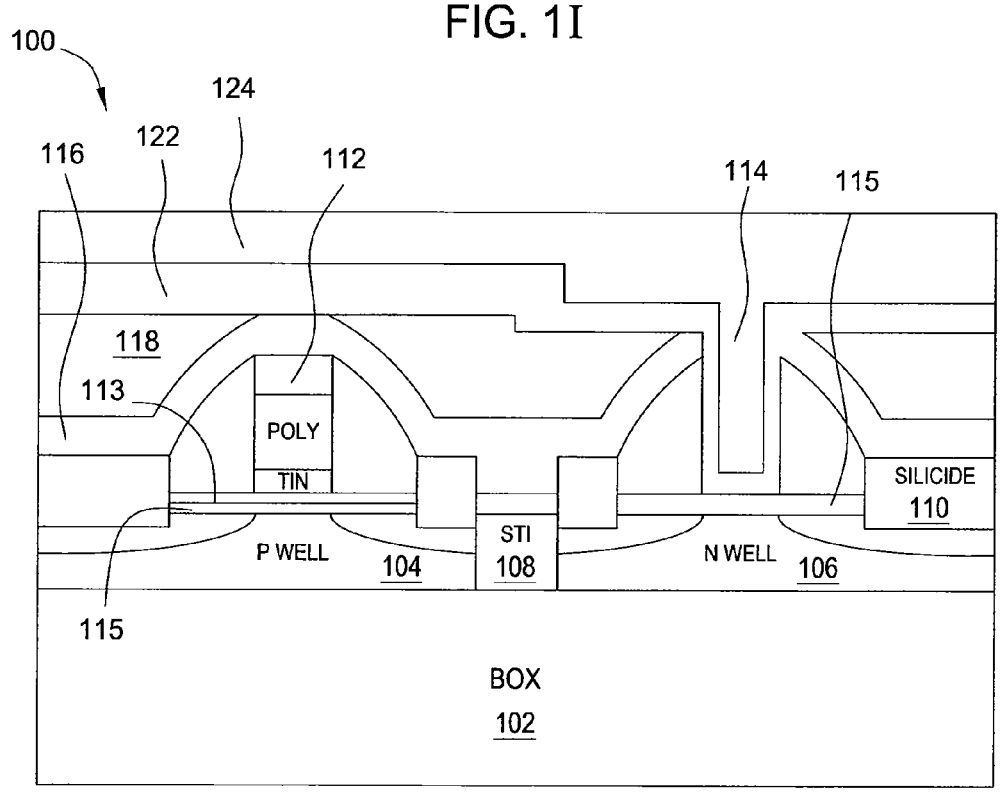
Figure 1K:
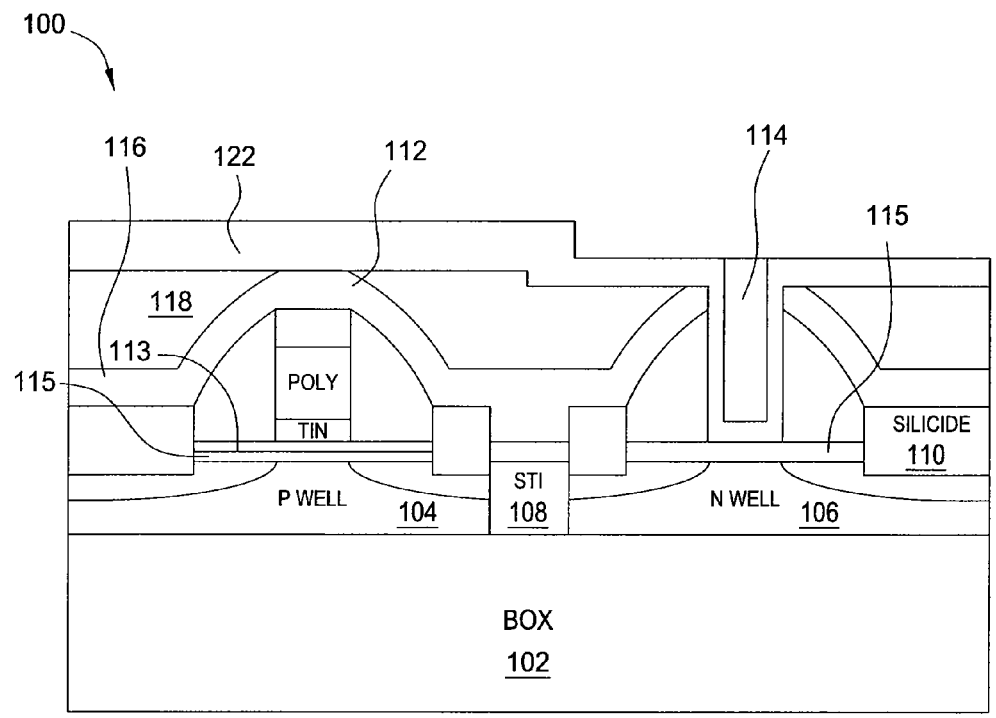
Figure 1L:
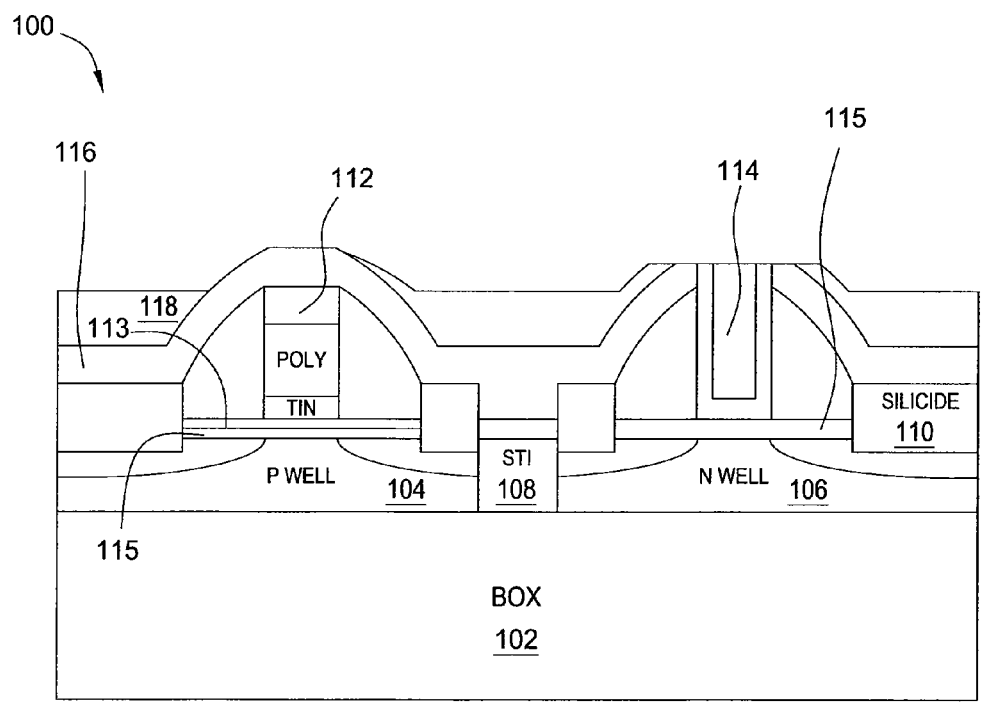
Figure 1M:
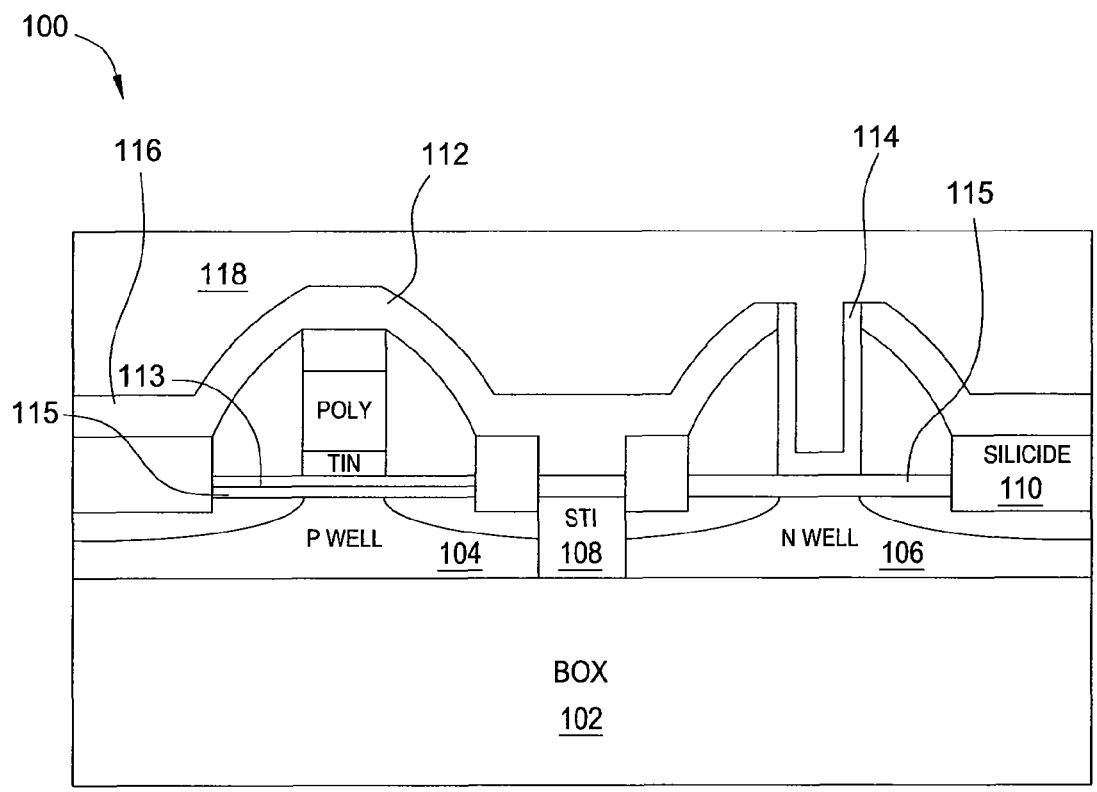
Figure 1N:
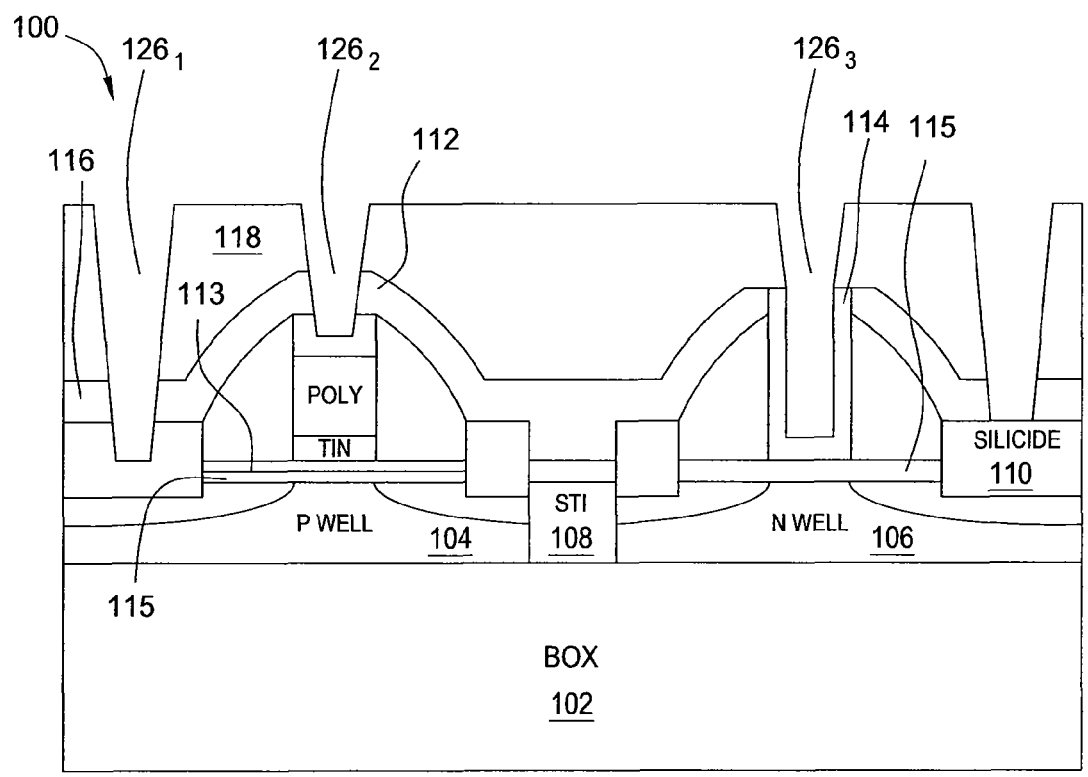
Figure 1O:
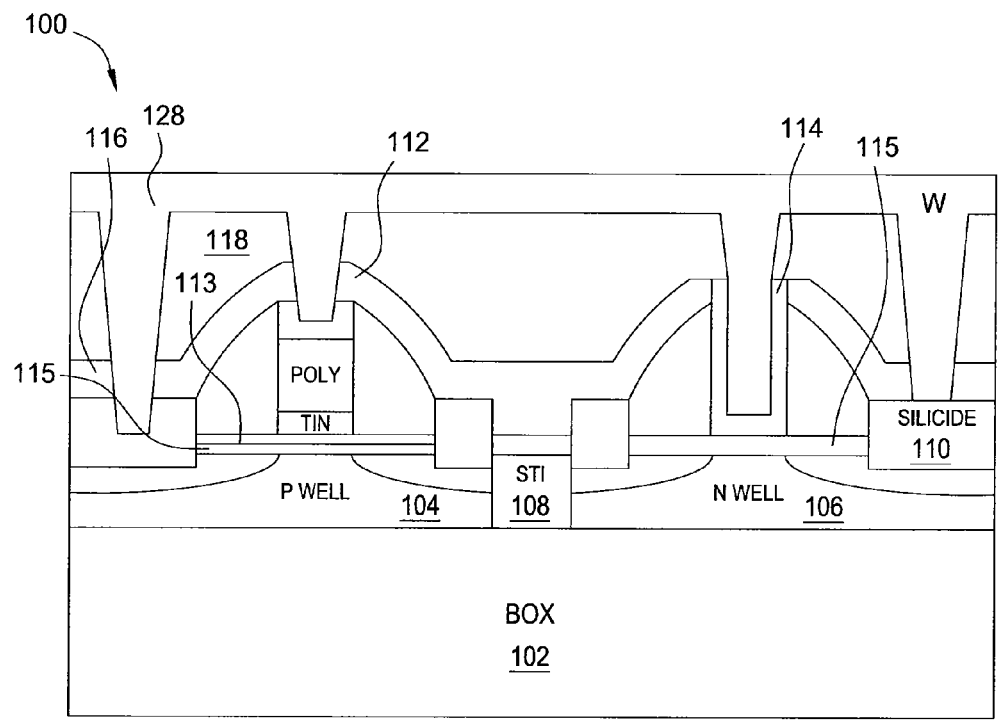
Figure 1P:
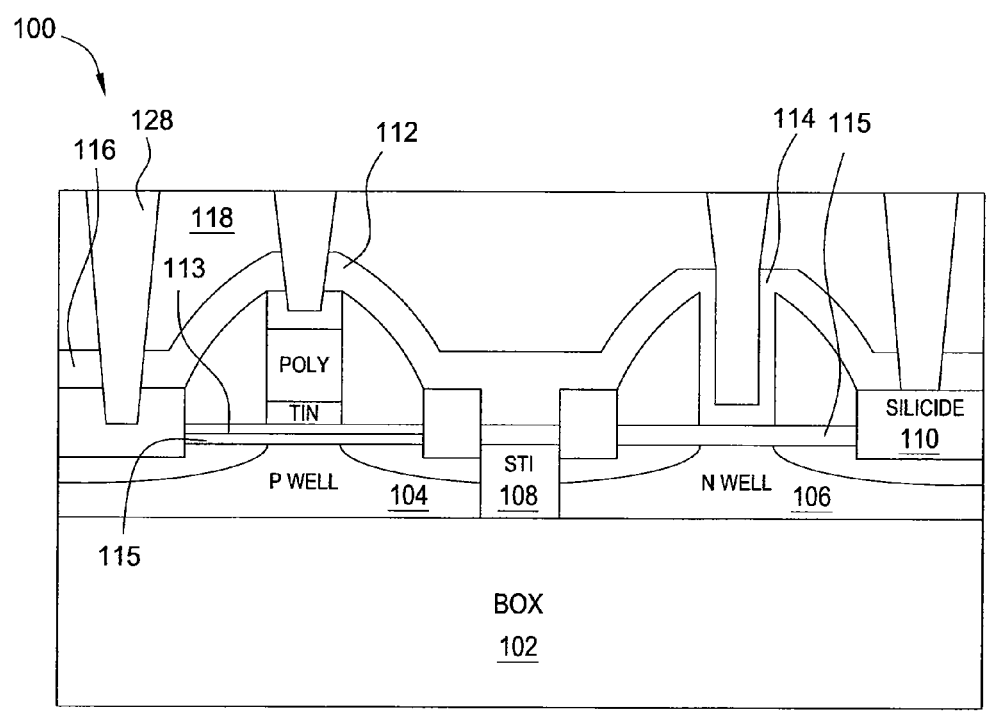

FIG. 1A-1P are cross-sectional diagrams illustrating various fabrication stages of a band-edge complementary metal-oxide-semiconductor (BE CMOS) device 100, according to a first embodiment of the present invention. As such, FIGS. 1A-1P also serve as a flow diagram for the inventive method.

In particular, FIG. 1A illustrates a beginning stage for fabrication of the BE CMOS device 100. As illustrated, at this stage, the BE CMOS device 100 comprises a buried oxide (BOX) layer 102, a first well 104 of p-type material deposited on the BOX layer 102, a second well 106 of n-type material deposited on the BOX layer 102, adjacent the first well 104, and a shallow trench isolation (STI) layer 108 separating the first well 104 from the second well 106. A silicide layer 110 is deposited over the first well 104, the second well 106, and the STI 108.

The first well 104 of p-type material is coupled to an n-type field effect transistor (nFET) 112, while the second well 106 of n-type material is coupled to a p-type FET (pFET) 114. Each of the pFET 114 and the nFET 112 comprises a high-k dielectric layer 115, a titanium nitride (TiN) layer (or alternatively a tantalum nitride (TaN) layer) as an electrode deposited over the high-k dielectric layer, and a polysilicon (poly) layer deposited over the TiN or TaN layer.

In one embodiment, the high-k dielectric layer comprises at least one of: hafnium oxide ($HfO_2$), zirconium oxide ($ZrO_2$), lanthanum oxide ($La_2O_3$), aluminum oxide ($Al_2O_3$), titanium oxide ($TiO_2$), strontium titanium oxide ($SrTiO_3$), lanthanum aluminum oxide ($LaAlO_3$), ytterbium oxide ($Y_2O_3$), $HfO_xN_y$, $ZrO_xN_y$, $La2O_xN_y$, $Al_2O_xN_y$, $TiO_xN_y$, $SrTiO_xN_y$, $LaAlO_xN_y$, $Y_2O_xN_y$, and silicates and mixtures thereof, wherein each value of x is independently from about 0.5 to about 3 and each value of y is independently from 0 to about 2.

FIG. 1A further illustrates the results of a gate first process (i.e., a conventional self-aligned high-temperature process at a temperature of greater than approximately 1000 degrees Celsius) that includes a first forming gas annealing process (in the range of approximately 400-500 degrees Celsius). The structure of the gate stack that goes through a gate first process consists of an electrically insulating capping layer 113 on the high-k dielectric layer 115 nFET 112, but not on the pFET 114. In one embodiment, a capping layer is formed on the pFET 114 but subsequently removed, for example by the methods described in U.S. patent application Ser. No. 11/927, 964, filed Nov. 30, 2007, which is herein incorporated by reference in its entirety. According to an exemplary embodiment, the capping layer 113 comprises one or more of: lanthanum oxide ($La_2O_3$), magnesium oxide (MgO), oxides of Group IIA and Group IIIB elements of the Periodic Table of Elements, and nitrides of Group IIa and Group IIIB elements. Capping layers are described, for example, in United States Patent Application Publication No. 2006/0289948 and No. 2006/0244035, both of which are herein incorporated by reference in their entireties. It is further noted that the capping layer 113 is depicted for illustrative purposes; although the capping layer 113 comprises a discrete layer during deposition, the capping layer 113 will mix with the dielectric gate stack at high temperatures (e.g., such as the temperatures at which the gate first process is carried out). As illustrated in FIG. 1B, a silicon nitride (SiN) layer 116 and an oxide layer 118 are next deposited over the pFET 114 and the nFET 112. In one embodiment, at least the oxide layer 118 is deposited by a high density plasma (HDP) deposition process.

As illustrated in FIG. 1C, chemical-mechanical planarization (CMP) is next employed to etch the oxide layer 118 down to the SiN layer 116 above the pFET 114 and the nFET 112. The region of the nFET 112 is next blocked by depositing a photoresist layer 120 over the region of the nFET 112, as illustrated in FIG. 1D.

As illustrated in FIG. 1E, the SiN layer 116 is then etched in the region of the pFET 114 only. The silicide layer 110 is then etched, again in the region of the pFET 114 only, as illustrated in FIG. 1F.

As illustrated in FIG. 1G, the photoresist layer 120 is next removed, in the regions of both the pFET 114 and the nFET 112. The polysilicon in the region of the pFET 114 only is then etched, as illustrated in FIG. 1H, leaving a trench in the region of the pFET 114.

As illustrated in FIG. 1I, the TiN layer is next etched, again only in the region of pFET 114. Next, a p-type metal layer (i.e., a high work function layer) 122 such as platinum, iridium, titanium nitride, ruthenium, tantalum carbon nitride, titanium aluminum nitride, tantalum carbon nitride, rhenium, or the like, is deposited over the regions of both the pFET 114 and the nFET 112, as illustrated in FIG. 1J. In addition, a first tungsten (W) layer 124 is deposited over the p-type metal layer 122. As illustrated, the p-type metal layer 122 and the first tungsten layer 124 fill in the trench in the region of the pFET 114 that was left by the etch of the polysilicon illustrated in FIG. 1H.

As illustrated in FIG. 1K, the first tungsten layer 124 is next removed above the regions of both the pFET 114 and the nFET 112. In one embodiment, the tungsten layer 124 is removed by CMP. Next, the p-type metal layer 122 is removed down to the SiN layer 116, as illustrated in FIG. 1L. In one embodiment, the p-type metal layer 122 is also removed by CMP.

As illustrated in FIG. 1M, the oxide layer 118 is next filled in. In one embodiment, the oxide layer 118 is filled in by HDP oxide deposition. Next, a plurality of contact areas $126_1$-$126_n$ (hereinafter collectively referred to as "contact areas 126") is opened in the CMOS device 100, as illustrated in FIG. 1N.

As illustrated in FIG. 1O, a second tungsten layer 128 is deposited over the regions of both the pFET 114 and the nFET 112. As illustrated, the second tungsten layer fills in the contact areas 126 opened in FIG. 1N. The second tungsten layer 128 is subsequently removed (e.g., by CMP) down to the oxide layer 118, as illustrated in FIG. 1P. This is followed by a second forming gas annealing process after metallization.

The nFET 112 is thus fabricated using a high-temperature gate first process, while the pFET 114 is fabricated using a low-temperature gate last process. That is, device integration of the nFET 112 is completed before the pFET 114 is fabricated. By using these different processes to fabricate the nFET 112 and the pFET 114, the benefits of using the gate first process for fabrication of the nFET 112 (e.g., lower Vt) can be retained, while the drawbacks of using the gate first process for the pFET 114 (e.g., interfacial regrowth, Vfb/Vt instability) can be avoided or reduced. Both the nFET 112 and the pFET 114 demonstrate BE characteristics.

In one embodiment, the gate last pFET is considered a "quasi-damascene" CMOS structure. This quasi-damascene structure, formed without high-K dielectric removal (i.e., only metal/polysilicon removal) prevents high-K gate dielectric redeposition on the sidewalls of the CMOS device 100, unlike conventional replacement gate processes. This avoids or reduces the occurrence of parasitic capacitances.

FIG. 2A-2M are cross-sectional diagrams illustrating various fabrication stages of a band-edge complementary metal-oxide-semiconductor (BE CMOS) device 200, according to a second embodiment of the present invention. As such, FIGS. 2A-2M also serve as a flow diagram for the inventive method.

Figure 2A:
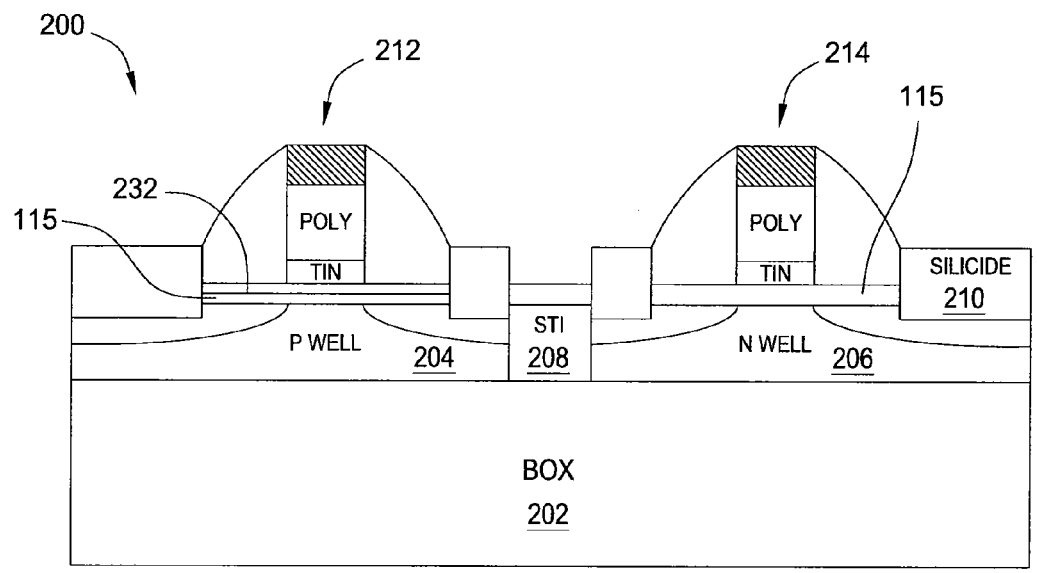
FIG. 2A-2M are cross-sectional diagrams illustrating various fabrication stages of a band-edge complementary metal-oxide-semiconductor device, according to a second embodiment of the present invention.

In particular, FIG. 2A illustrates a beginning stage for fabrication of the BE CMOS device 200. As illustrated, at this stage, the BE CMOS device 200 comprises a buried oxide (BOX) layer 202, a first well 204 of p-type material deposited on the BOX layer 202, a second well 206 of n-type material deposited on the BOX layer 202, adjacent the first well 204, and a shallow trench isolation (STI) layer 208 separating the first well 204 from the second well 206. A silicide layer 210 is deposited over the first well 204, the second well 206, and the STI 208.

The first well 204 of p-type material is coupled to an n-type field effect transistor (pFET) 212, while the second well 206 of n-type material is coupled to a p-type FET (nFET) 214. Each of the pFET 214 and the nFET 212 comprises a high-k dielectric layer 215, a titanium nitride (TiN) layer (or alternatively a tantalum nitride (TaN) layer) as an electrode deposited over the high-k dielectric layer, and a polysilicon (poly) layer deposited over the TiN or TaN layer. Each of the pFET 214 and nFET 212 additionally comprises a hard mask (e.g., a nitride hard mask) deposited over the polysilicon layer.

In one embodiment, the high-k dielectric layer comprises at least one of: hafnium oxide ($HfO_2$), zirconium oxide ($ZrO_2$), lanthanum oxide ($La_2O_3$), aluminum oxide ($Al_2O_3$), titanium oxide ($TiO_2$), strontium titanium oxide ($SrTiO_3$), lanthanum aluminum oxide ($LaAlO_3$), ytterbium oxide ($Y_2O_3$), $HfO_xN_y$, $ZrO_xN_y$, $La2O_xN_y$, $Al_2O_xN_y$, $TiO_xN_y$, $SrTiO_xN_y$, $LaAlO_xN_y$, $Y_2O_xN_y$, and silicates and mixtures thereof, wherein each value of x is independently from about 0.5 to about 3 and each value of y is independently from 0 to about 2.

FIG. 2A further illustrates the results of a gate first process (e.g., a gas annealing process), which produces a capping layer 213 on the nFET 212, but not on the pFET 214. The capping layer 213 is formed as described above with respect to FIG. 1.

Figure 2B:
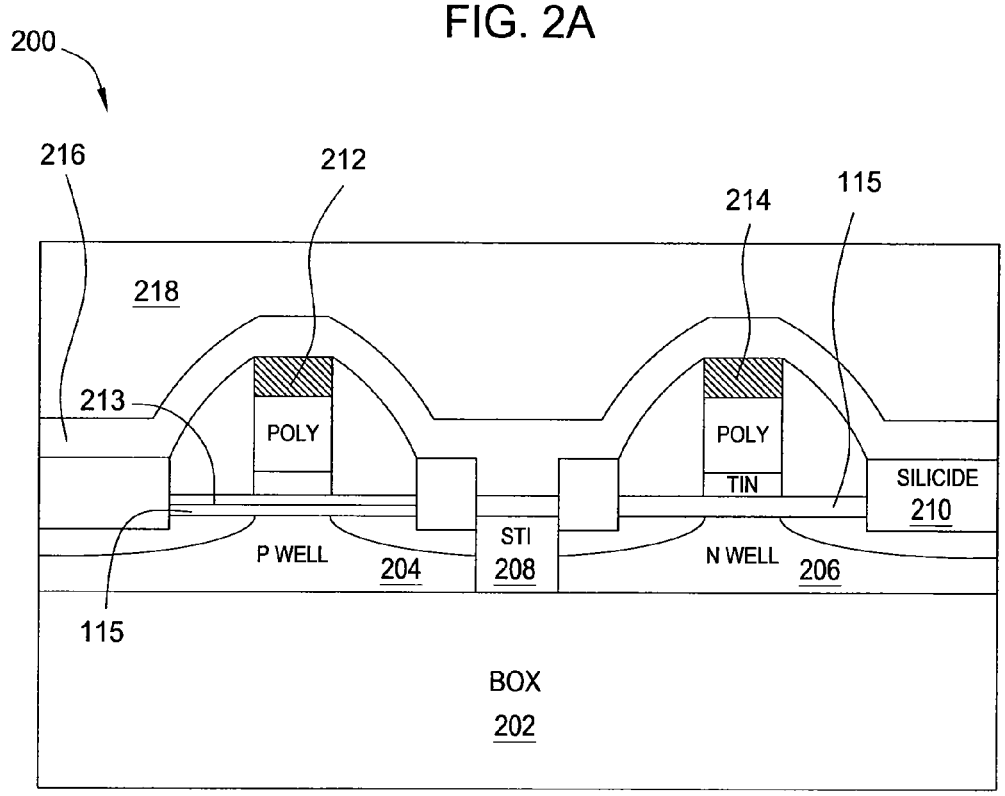

As illustrated in FIG. 2B, a silicon nitride (SiN) layer 216 and an oxide layer 218 are next deposited over the pFET 214 and the nFET 212. In one embodiment, at least the oxide layer 218 is deposited by a high density plasma (HDP) deposition process.

Figure 2C:
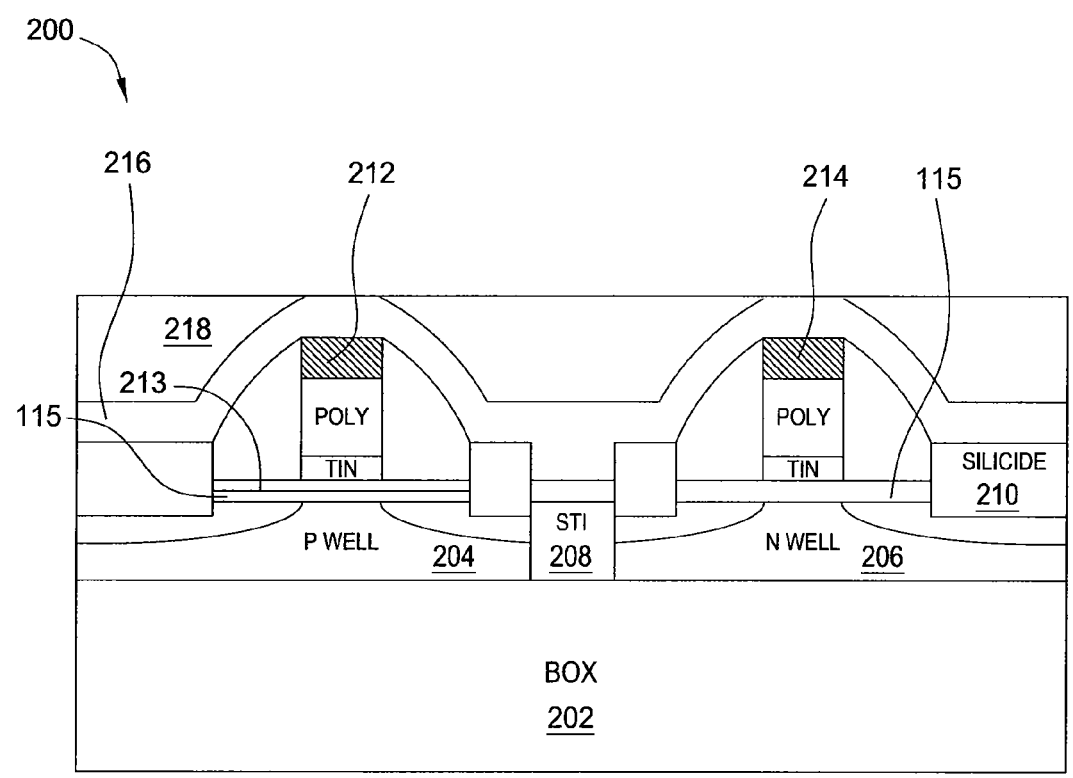
Figure 2D:
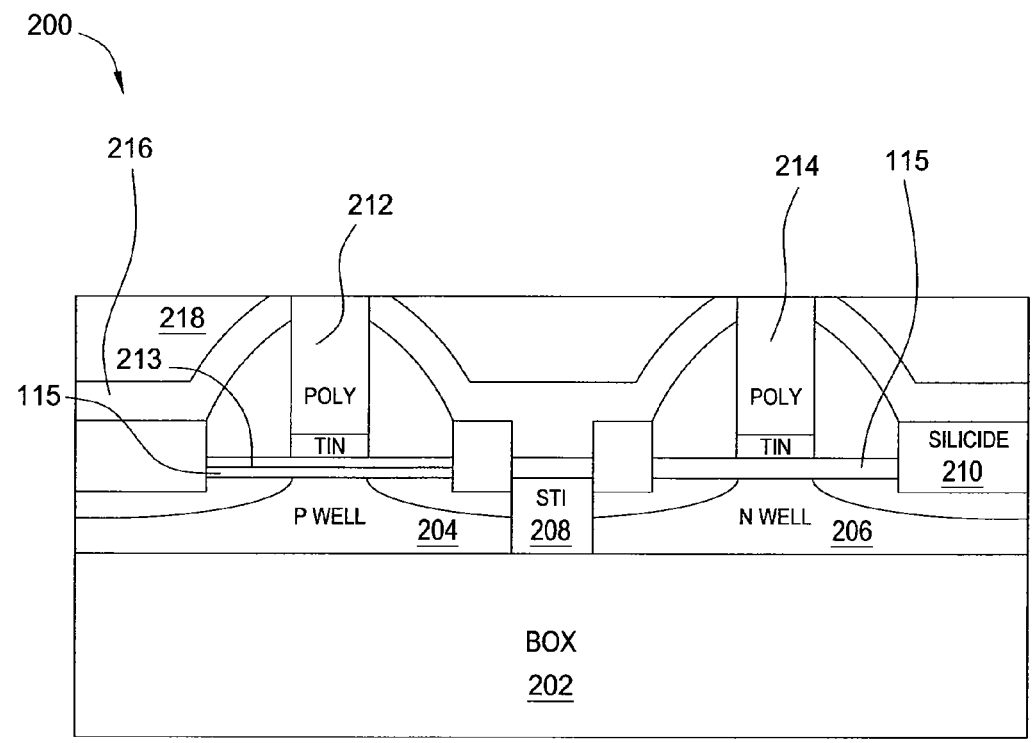

As illustrated in FIG. 2C, chemical-mechanical planarization (CMP) is next employed to etch the silicon nitride layer 216 and the oxide layer 218 down to the polysilicon layers of the pFET 214 and the nFET 212. Further CMP planarizes through the hard masks on the pFET 214 and the nFET 212, all the way down to the polysilicon layers, as illustrated in FIG. 2D.

Figure 2E:
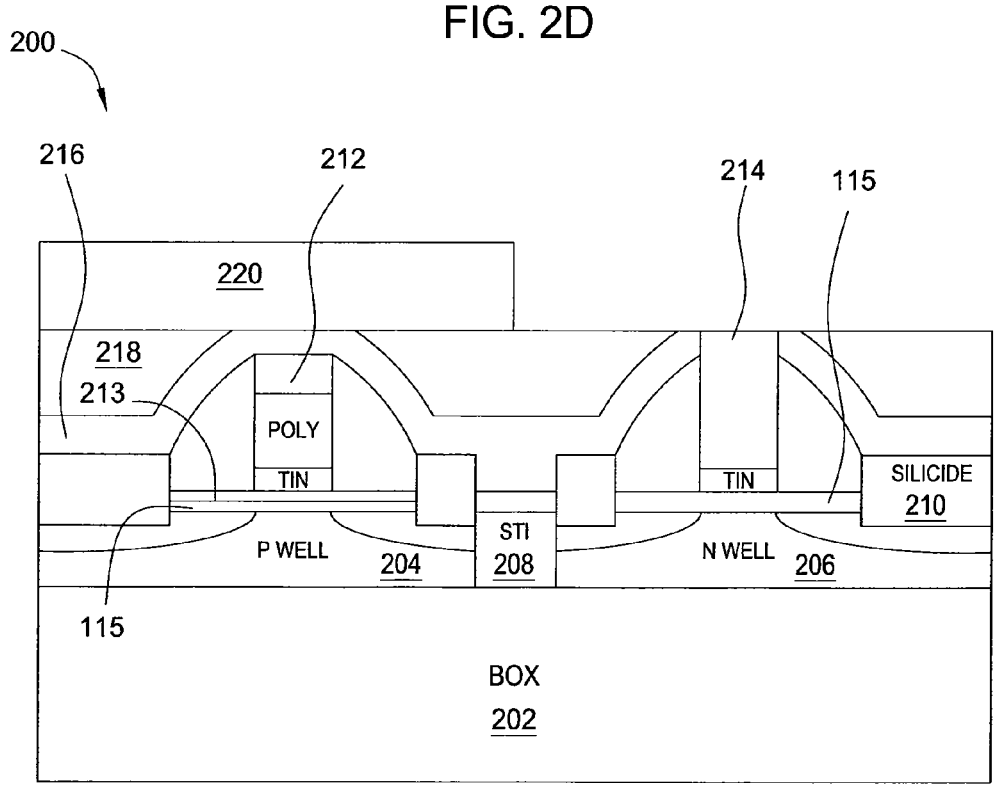
Figure 2F:
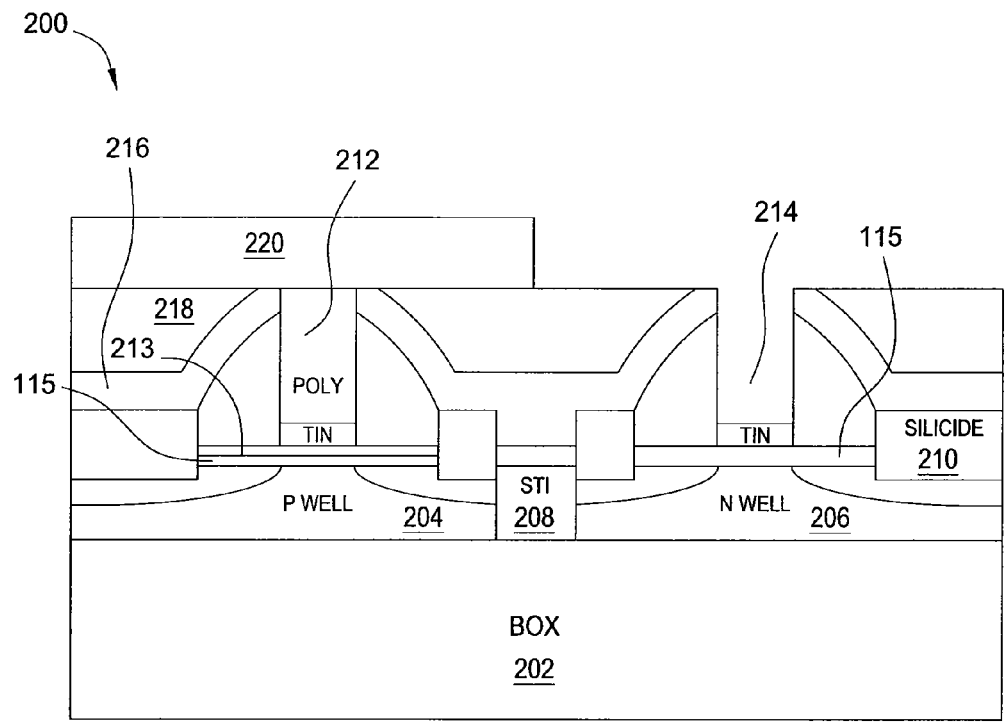

The region of the nFET 212 is next blocked by depositing a photoresist layer 220 over the region of the nFET 212, as illustrated in FIG. 2E. The polysilicon of the pFET 214 remains exposed so that the polysilicon in the region of the pFET 214 only can then be etched, as illustrated in FIG. 2F. Etching of the polysilicon leaves a trench in the region of the pFET 214 above the TiN layer. Although the polysilicon of the nFET is illustrated as being protected by the photoresist layer 220 during this process, those skilled in the art will realize that simultaneous protection of the nFET polysilicon and exposure of the pFET polysilicon can also be accomplished through inventive chemistry or etching techniques that do not require a mask.

Figure 2G:
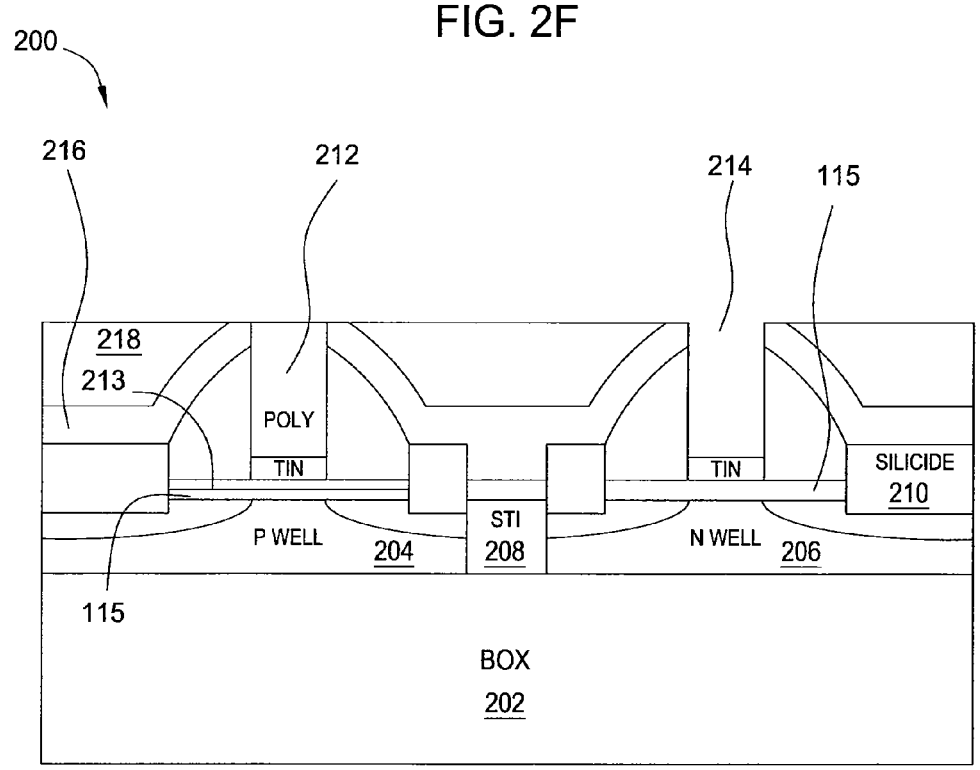
Figure 2H:
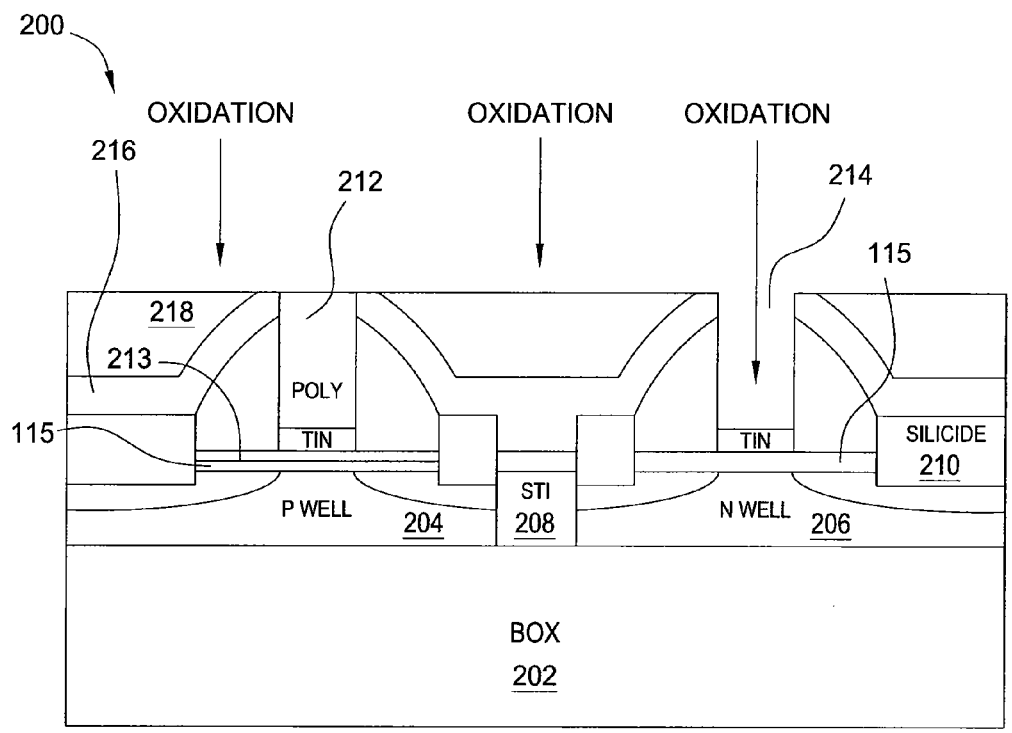

As illustrated in FIG. 2G, the photoresist layer 220 is next removed. The TiN layer of the pFET 214 only is then exposed to oxidation, as illustrated in FIG. 2H, to produce oxidized TiN. In one embodiment, the oxidation step occurring in FIG. 2H is a top-down oxidation process. In another embodiment, oxidation is performed in dilute oxygen for temperatures less than or equal to 500 degrees Celsius and for partial pressures less than 100 torr. The polysilicon over the nFET TiN protects the TiN in the region of the nFET 212.

Figure 2I:
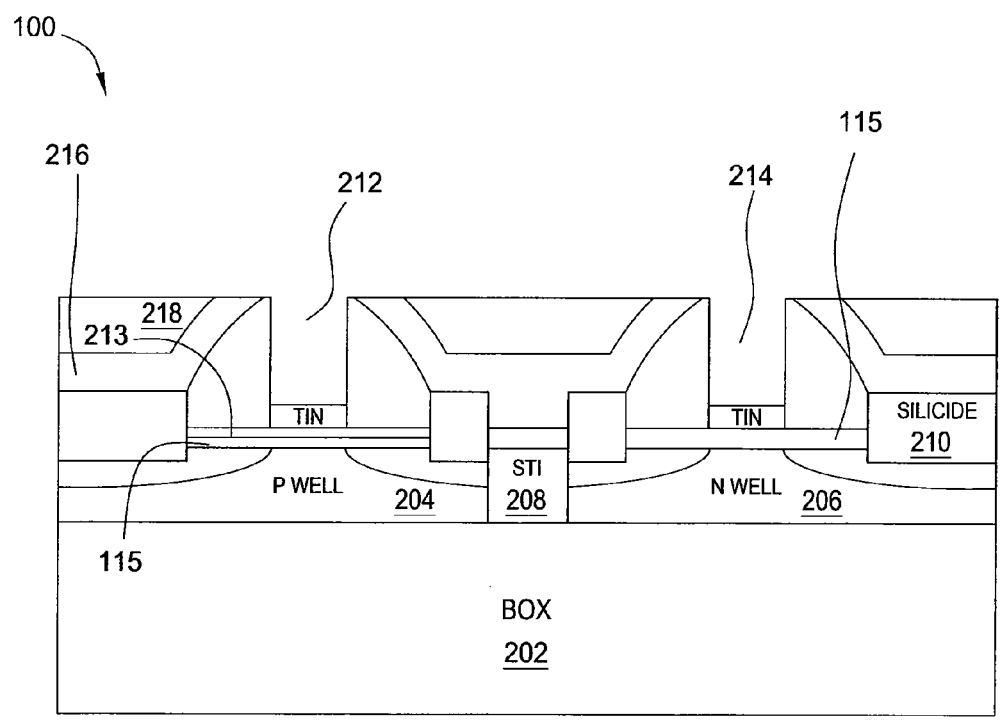
Figure 2J:
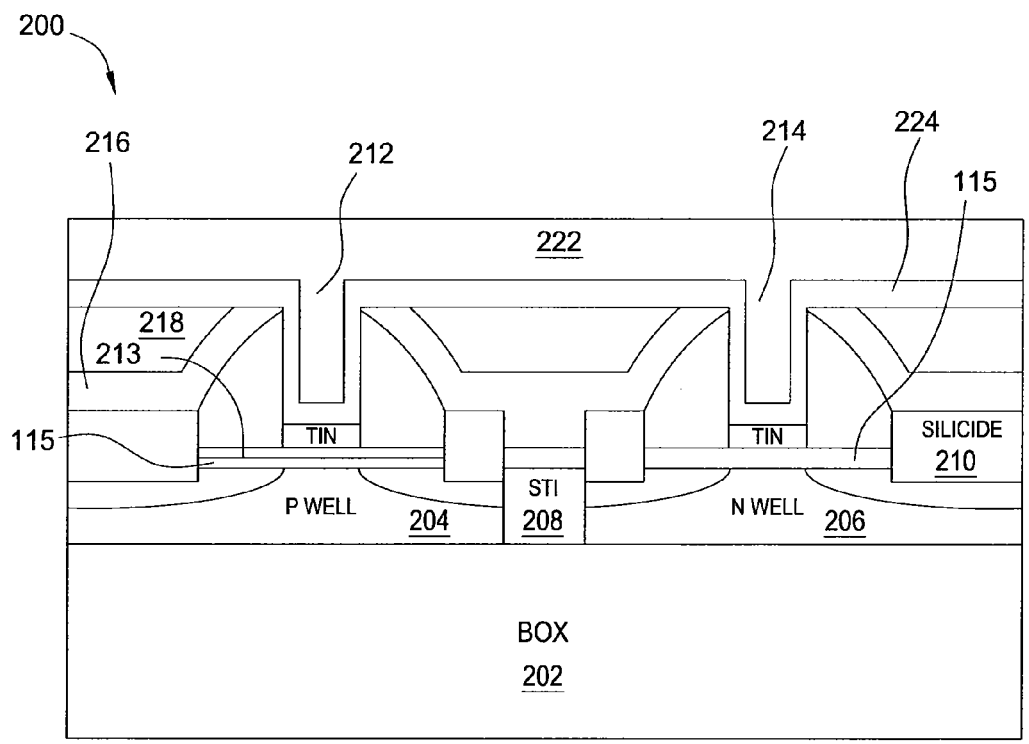

Next, the polysilicon in the region of the nFET 212 is etched, as illustrated in FIG. 2I, creating a trench in the region of the nFET 212 above the TiN layer. A first metal layer 224 (e.g., titanium nitride (TiN) or tantalum nitride (TaN)) is then deposited over the regions of both the pFET 214 and the nFET 212, as illustrated in FIG. 2J, and followed with a second metal layer 222 (e.g., tungsten (W), titanium (Ti), aluminum (Al), ruthenium (Ru), copper (Cu), and/or rhodium (Rh)). In one embodiment, the first metal layer 224 is deposited by atomic layer deposition (ALD), while the second metal layer 222 is deposited by chemical vapor deposition (CVD), physical vapor deposition (PVD), and/or plating. In one embodiment, the second metal layer 222 comprises tungsten deposited by CVD. In another embodiment, the second metal layer 222 comprises titanium deposited by PVD and aluminum deposited by PVD reflow. In another embodiment yet, the second metal layer 222 comprises ruthenium deposited by CVD and copper or rhodium deposited by plating. As illustrated, the first metal layer 224 and the second metal layer 222 fill in the trenches in the regions of the pFET 214 and the nFET 212 that was left by the etch of the polysilicon.

Figure 2K:
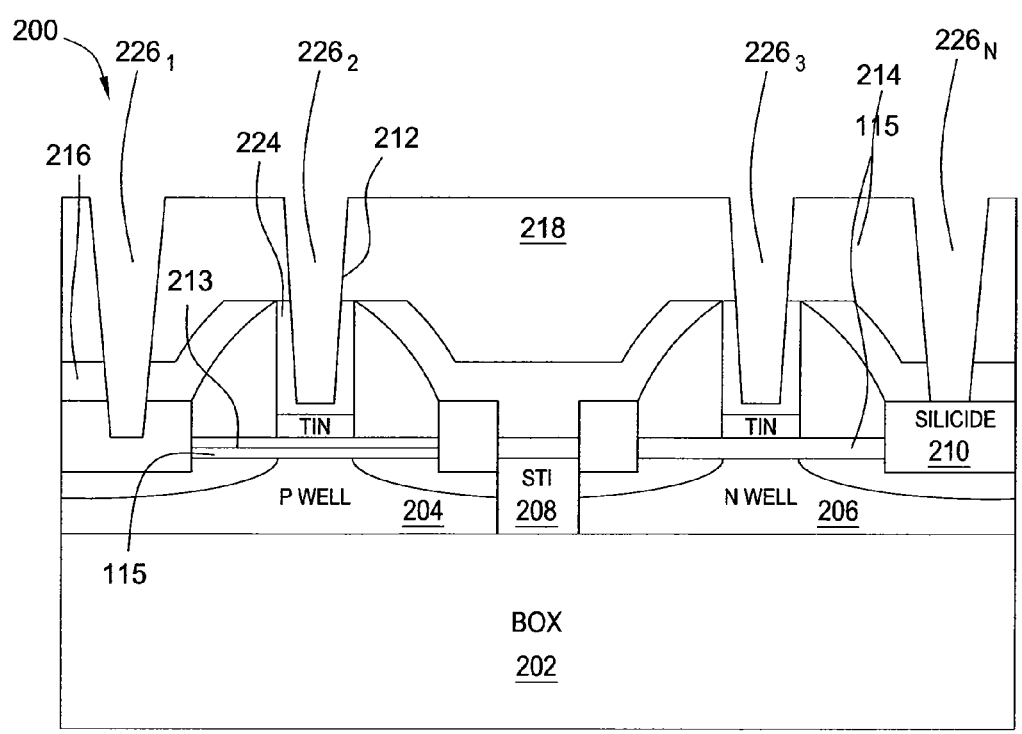

As illustrated in FIG. 2K, the second metal layer 222 is next removed above the regions of both the pFET 214 and the nFET 212 (e.g., by CMP), the first metal layer 224 is removed down to the SiN layer 216 (e.g., by CMP), and a plurality of contact areas $226_1$-$226_n$ (hereinafter collectively referred to as "contact areas 226") is opened in the CMOS device 200. The contact areas 226 in the regions of the pFET 214 and the nFET 212 are opened all the way down to the second metal layer 222.

Figure 2L:
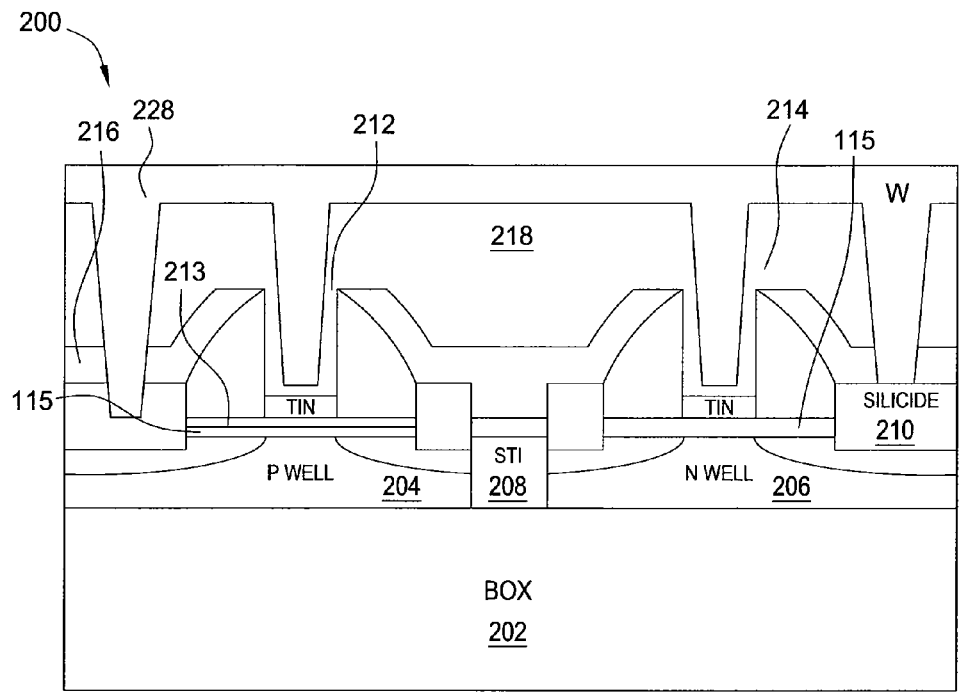
Figure 2M:
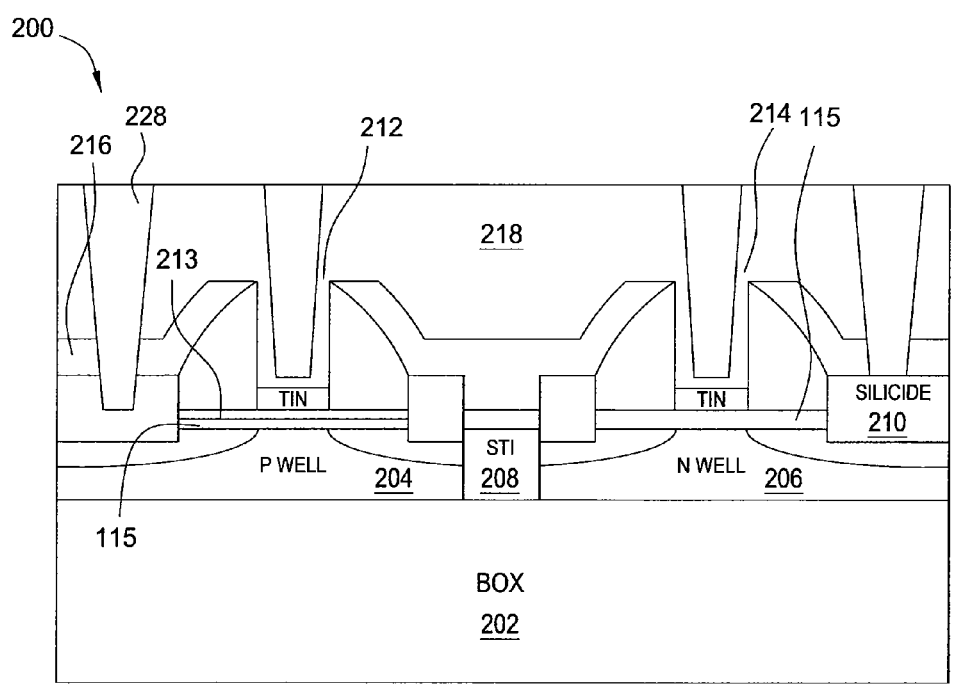

As illustrated in FIG. 2L, a tungsten layer 228 is deposited over the regions of both the pFET 114 and the nFET 112. As illustrated, the tungsten layer fills in the contact areas 226 opened in FIG. 2K. The tungsten layer 228 is subsequently removed (e.g., by CMP) down to the oxide layer 218, as illustrated in FIG. 2M. This is followed by a forming gas annealing process after metallization. The resultant CMOS device 200 thus includes an nFET comprising TiN or TaN, a Group IIA or Group IIIB element containing cap, and a metal layer and a pFET comprising TiN or TaN (modified by a process comprising oxygen) and a metal layer.

While the foregoing is directed to embodiments of the present invention, other and further embodiments of the invention may be devised without departing from the basic scope thereof. Various embodiments presented herein, or portions thereof, may be combined to create further embodiments. Furthermore, terms such as top, side, bottom, front, back, and the like are relative or positional terms and are used with respect to the exemplary embodiments illustrated in the figures, and as such these terms may be interchangeable.

What is claimed is:

1. A method for fabricating a complementary metal-oxide-semiconductor device comprising an n-type metal-oxide-semiconductor device and a p-type metal-oxide-semiconductor device, the method comprising:

fabricating the n-type metal-oxide-semiconductor device using a gate first process, the n-type metal-oxide-semiconductor device comprising a first polysilicon layer and a first silicide layer deposited on the first polysilicon layer; and fabricating the p-type metal-oxide-semiconductor device using a gate last process without exposing the first polysilicon layer of the n-type metal-oxide-semiconductor device, the p-type metal-oxide-semiconductor device comprising a second polysilicon layer and a second silicide layer deposited on the second polysilicon layer, wherein the fabricating the p-type metal-oxide-semiconductor device comprises:

creating a trench in a region of the p-type metal-oxide-semiconductor device;

lining the trench with a layer of p-type metal;

depositing a tungsten layer over the layer of p-type metal;

depositing a silicon nitride layer over the n-type metal-oxide-semiconductor and the p-type metal-oxide-semiconductor device, prior to creating the trench; and depositing an oxide layer over the silicon nitride layer, wherein creating the trench comprises:

etching the oxide layer down to the silicon nitride layer above the n-type metal-oxide-semiconductor device and the p-type metal-oxide-semiconductor device;

etching the silicon nitride layer above the p-type metal-oxide-semiconductor device only; and etching the second silicide layer without etching the first silicide layer;

etching the second polysilicon layer without etching the first polysilicon layer; and etching a titanium nitride layer in the region of the p-type metal-oxide-semiconductor device only.

2. The method of claim 1, further comprising:

depositing a photoresist layer over the n-type metal-oxide-semiconductor device prior to etching the silicon nitride layer; and removing the photoresist layer after etching the silicon nitride layer but prior to etching the second polysilicon layer.

3. The method of claim 1, further comprising:

opening a plurality of contact areas in the complementary metal-oxide-semiconductor device;

depositing a tungsten layer over the n-type metal-oxide-semiconductor device and the p-type metal-oxide-semiconductor device, such that the plurality of contact areas is filled with tungsten; and removing a portion of the tungsten layer.

4. The method of claim 1, wherein the n-type metal-oxide-semiconductor device is capped with a layer of a material comprising at least one element from Group IIA or Group IIIB of the Periodic Table of Elements.

5. The method of claim 4, wherein the n-type metal-oxide-semiconductor device is capped with a layer of an oxide of a Group IIA or Group IIIB element or a nitride of a Group IIA or Group IIIB element.

6. The method of claim 5, wherein the n-type metal-oxide-semiconductor device is capped with a layer of lanthanum oxide or magnesium oxide.

7. The method of claim 1, wherein the p-type metal-oxide-semiconductor device is a quasi-damascene structure.

8. The method of claim 1, wherein the p-type metal-oxide-semiconductor device comprises a layer of TiN or TaN, modified by exposure to oxygen.

9. The method of claim 1, wherein each of the n-type metal-oxide-semiconductor device and a p-type metal-oxide-semiconductor device comprises:

a high-k dielectric layer comprising at least one of: hafnium oxide ($HfO_2$), zirconium oxide ($ZrO_2$), lanthanum oxide ($La_2O_3$), aluminum oxide ($Al_2O_3$), titanium oxide ($TiO_2$), strontium titanium oxide ($SrTiO_3$), lanthanum aluminum oxide ($LaAlO_3$), ytterbium oxide ($Y_2O_3$), $HfO_xN_y$, $ZrO_xN_y$, $La2O_xN_y$, $Al_2O_xN_y$, $TiO_xN_y$, $SrTiO_xN_y$, $LaAlO_xN_y$, $Y_2O_xN_y$, a silicate thereof, and a mixture thereof;

a titanium nitride deposited over the high-k dielectric layer; and a polysilicon layer deposited over the titanium nitride layer.

10. The method of claim 1, wherein the complementary metal-oxide-semiconductor device is a band edge device.

11. The method of claim 1, wherein a device integration of the n-type metal-oxide-semiconductor device is completed before fabricating the p-type metal-oxide-semiconductor device.

12. The method of claim 1, wherein the p-type metal is: platinum, iridium, titanium nitride, ruthenium, tantalum carbon nitride, titanium aluminum nitride, tantalum carbon nitride, or rhenium.

13. The method of claim 1, wherein the oxide layer is deposited by a high density plasma deposition process.

* * * * *